US008053719B2

(12) United States Patent
Seol et al.

(10) Patent No.: US 8,053,719 B2
(45) Date of Patent: Nov. 8, 2011

(54) IMAGE SENSOR USING PHOTO-DETECTING MOLECULE AND METHOD OF OPERATING THE SAME

(75) Inventors: Kwang-soo Seol, Yongin-si (KR); Yoon-dong Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 367 days.

(21) Appl. No.: 12/385,122

(22) Filed: Mar. 31, 2009

(65) Prior Publication Data

US 2009/0294633 A1 Dec. 3, 2009

(30) Foreign Application Priority Data

May 28, 2008 (KR) ........................ 10-2008-0049677

(51) Int. Cl.
*H01L 31/00* (2006.01)
*H01L 27/00* (2006.01)

(52) U.S. Cl. .................................. 250/214.1; 250/208.1

(58) Field of Classification Search ............... 250/208.1, 250/214.1, 214 R
See application file for complete search history.

(56) References Cited

U.S. PATENT DOCUMENTS 4,839,511 A * 6/1989 Thompson et al. ........ 250/214.1

* cited by examiner

*Primary Examiner* — Thanh X Luu
(74) *Attorney, Agent, or Firm* — Harness, Dickey & Pierce, P.L.C.

(57) ABSTRACT

Provided is an image sensor using a photo-detecting molecule and a method of operating the image sensor. The image sensor may include a plurality of first electrodes disposed parallel to each other and a plurality of second electrodes disposed parallel to each other in a direction perpendicular to the first electrodes and above the first electrodes, and a plurality of subpixels formed in regions where the first electrodes cross the second electrodes. Each of the subpixels may comprise a photo-detecting molecule layer that may generate charges by absorbing light having a certain wavelength, a charge generation layer that may form a plurality of secondary electrons by receiving the charges from the photo-detecting molecule layer when a known voltage is applied between the first electrodes and the second electrodes, and a variable resistance layer, an electrical state of which is changed by receiving the secondary electrons generated from the charge generation layer.

20 Claims, 7 Drawing Sheets

IMAGE SENSOR USING PHOTO-DETECTING MOLECULE AND METHOD OF OPERATING THE SAME

PRIORITY STATEMENT

This application claims priority under 35 U.S.C. §119 to Korean Patent Application No. 10-2008-0049677, filed on May 28, 2008, in the Korean Intellectual Property Office (KIPO), the entire contents of which are incorporated herein by reference.

BACKGROUND

1. Field

Example embodiments are directed to an image sensor using a photo-detecting molecule and a method of operating the same.

2. Description of the Related Art

A color image sensor is a photoelectric conversion device that converts light into an electric signal. A conventional image sensor includes a plurality of unit pixels arranged in an array on a semiconductor substrate. Each unit pixel includes a photodiode and a plurality of transistors. The photodiode generates and stores photocharges by detecting external light and the transistors output electrical signals according to the generated photocharges.

A complimentary metal oxide semiconductor (CMOS) image sensor includes a photodiode that receives and stores an optical signal. The CMOS image sensor also displays an image via a control device that controls or processes the optical signal. The control device can be manufactured using a CMOS manufacturing technique, and thus, the CMOS image sensor can be manufactured on one chip together with various signal processing devices.

A conventional CMOS image sensor outputs an amount of received light as a voltage, and the outputted voltage is read in a digital data by an analog-digital converter. Also, in order to measure charges generated in response to light, three or four transistors are required. Accordingly, it is difficult to form a single unit pixel on a sub-micron level.

In the conventional CMOS image sensors, as the pixel size is reduced, the photodiode area is further reduced, and thus, the sensitivity and dynamic range of the image sensors is reduced. Also, due to the diffraction of light, incident light cannot be focused on a single pixel but spreads to adjacent pixels, and thus, image resolution may be reduced.

SUMMARY

To address the above and/or other problems, example embodiments provide an image sensor that may use a photo-detecting molecule. The image sensor may include a plurality of unit pixels comprising subpixels that may be sub-micron in size and store information as single data when light is irradiated thereon.

Example embodiments are also directed to a method of operating the image sensor.

According to example embodiments, an image sensor may include a plurality of the first electrodes disposed parallel with each other and a plurality of the second electrodes disposed parallel with each other in a direction perpendicular to the first electrodes and above the first electrodes; and a plurality of subpixels formed in regions where the first electrodes cross the second electrodes. At least one of the first electrodes and the second electrodes may be transparent electrodes.

Each subpixel may include a photo-detecting molecule layer that may generate charges by absorbing light having a certain wavelength; a charge generation layer that may form a plurality of secondary electrons by receiving the charges from the photo-detecting molecule layer when a voltage is applied to the subpixel; and a variable resistance layer, an electrical state of which may be changed by the secondary electrons received from the charge generation layer.

According to an example embodiment, an image sensor may include: a plurality of first electrode units disposed parallel to each other and a plurality of second electrode units disposed parallel to each other in a direction perpendicular to the first electrode units and above the first electrode units; a plurality of first electrodes perpendicular to the first electrode units and extending from the first electrode units towards the second electrode units; a plurality of second electrodes perpendicular to the second electrode units and extending from the second electrode units towards the first electrode units; and a plurality of subpixels formed between the first electrode and the second electrode. Each subpixel may include a photo-detecting molecule layer that may generate charges by absorbing light having a certain wavelength; a charge generation layer that may form a plurality of secondary electrons by receiving the charges from the photo-detecting molecule layer when a voltage is applied to the subpixel; and a variable resistance layer, an electrical state of which may be changed by the secondary electrons received from the charge generation layer.

According to an example embodiment, a method of operating an image sensor may include: applying a first voltage between the first electrode and the second electrode to form an electrical field therebetween; writing information in subpixels by irradiating light on the photo-detecting molecule layer; reading information recorded in the subpixels; and erasing information recorded in the subpixels.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
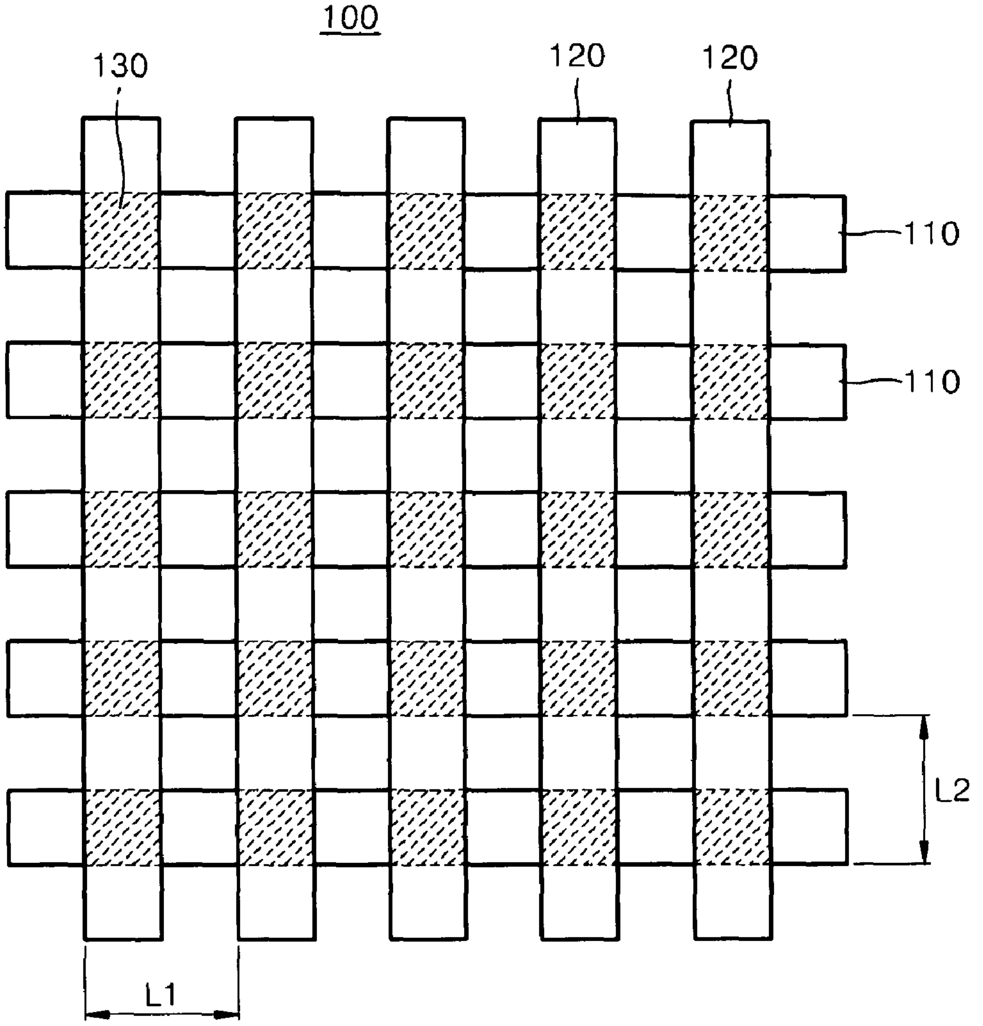
FIG. 1 is a plan view of a unit pixel of an image sensor that uses a photo-detecting molecule, according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates a plan view of a unit pixel 100 of an image sensor using a photo-detecting molecule, according to an example embodiment. Referring to FIG. 1, a plurality of lower electrodes 110 having a stripe shape may be disposed parallel to each other. Also, a plurality of upper electrodes 120 having a stripe shape may be disposed parallel to each other. The lower electrodes 10 and the upper electrodes 120 may be separated by a known gap, and the upper electrodes 120 may be disposed in a direction perpendicular to the lower electrodes 110. A plurality of subpixels 130 may be formed in regions where the lower electrodes 110 and the upper electrodes 120 cross.

The unit pixel 100 may form one of a red pixel R, a green pixel G, and/or a blue pixel B. The unit pixel 100 may include a plurality of subpixels 130.

A micro lens, for example, a focusing lens may further be installed on the unit pixel 100. For convenience, the configuration of the focusing lens is omitted in FIG. 1.

The unit pixel 100 of FIG. 1 may include subpixels 130 in a matrix arrangement of 5×5, for example. Lengths of two sides of the single subpixel 130 may be L1 and L2, respectively. For example, if lengths of the two sides of the unit pixel 100 respectively are 2 μm, L1 and L2 of the subpixel 130 may be 400 nm, respectively. Lengths of the sides of the unit pixel 100 and the subpixel 130 are not restricted thereto and may be modified appropriately.

Figure 2:
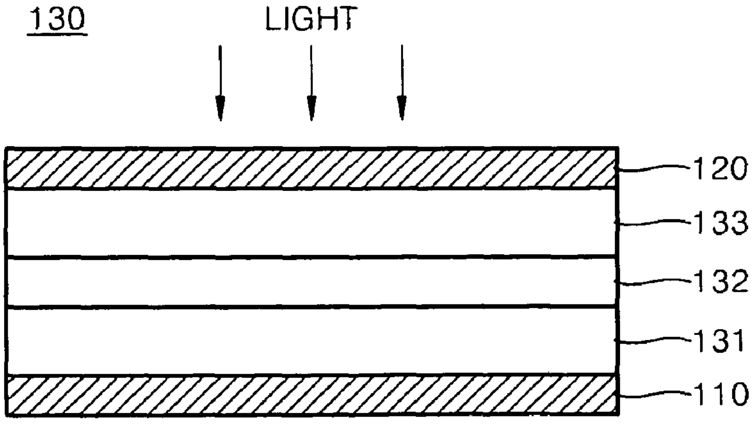
FIG. 2 is a cross-sectional view of the structure of a single subpixel of FIG. 1.

FIG. 2 illustrates a cross-sectional view of the structure of a single subpixel 130 of FIG. 1.

Referring to FIG. 2, a variable resistance layer 131, a charge generation layer 132, and a photo-detecting molecule layer 133 may be stacked between the lower electrode 110 and the upper electrode 120. The photo-detecting molecule layer 133 may be formed on a side of the subpixel 130 to receive light.

The photo-detecting molecule layer 133 may form electron-hole pairs by absorbing light of a certain wavelength. The photo-detecting molecule layer 133 may be a thin film of polymethyl methacrylate (PMMA) or polybutyl acrylate (PBA) that may include an organic dye or a polymer dye. The photo-detecting molecule layer 133 may absorb light of a certain wavelength, for example, a red, green, or blue wavelength according to a material used to form the photo-detecting molecule layer 133.

A dye that may absorb blue wavelength may be p-Terphenyl, Polyphenyl 1, Stilbene 1, Stilbene 3, Coumarin 2, Courmarin 47, and/or Coumarin 102.

A dye that may absorb green wavelength may be Coumarin 30 and/or Rhodamine 6G.

A dye that may absorb red wavelength may be Rhodamine B, DCM (4 dycyanomethylene-2methyl-6-p-dimethylaminostyryl-4H-pyran), and/or Rhodamine 700.

The charge generation layer 132 may be formed of a material having a band gap of 1.0 eV or less in order to form a large amount of electron-hole pairs using a small energy. The charge generation layer 132 may be formed of polyisothionaphthene (Eg=0.75 eV) or a copolymer (Eg=0.92 eV) in which quinonoid and benzoid are alternately formed.

The electrical state of the variable resistance layer 131 may be changed by the migration of secondary electrons generated in the charge generation layer 132. The variable resistance layer 131 may be formed of a material such as porphyrin group polymer that may store charges, or of a reconfigurable organic molecule such as catacene.

The variable resistance layer 131 may also be formed of a programmable metallization cell material, for example, a nickel oxide, a vanadium oxide or an iron oxide, the resistance state of which may be changed, for example, raised or lowered depending on a current.

The upper electrode 120 may be formed of indium tin oxide (ITO), and light may be irradiated onto the photo-detecting molecule layer 133 through the upper electrode 120. The lower electrode 110 may be formed of a material conventionally used to form electrodes.

Figure 3:
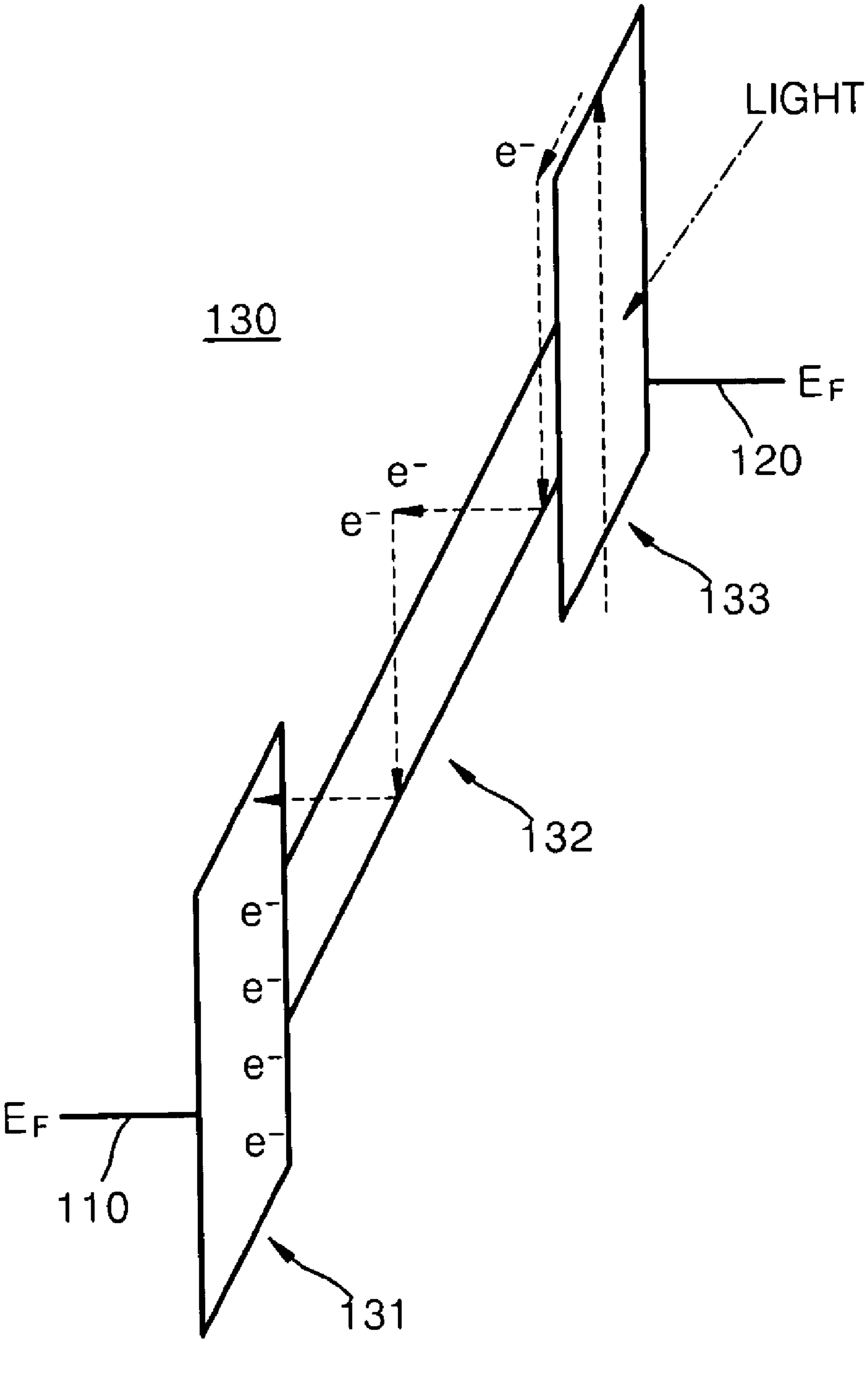
FIG. 3 is a band energy diagram of an image sensor that uses a photo-detecting molecule according to an example embodiment.

FIG. 3 illustrates a band diagram of an image sensor that uses a photo-detecting molecule according to an example embodiment.

Referring to FIG. 3, when a voltage, for example, 3V to 5V is applied between the lower electrode 110 and the upper electrode 120, and a positive voltage is applied to the lower electrode 110, the potential of the lower electrode 110 is lower than that of the upper electrode 120. When light is irradiated onto the photo-detecting molecule layer 133, the photo-detecting molecule layer 133 may generate electron-hole pairs. Holes may be discharged to the outside through the upper electrode 120, and electrons may move to the charge generation layer 132. At this point, the energy of the electrons may be reduced while the electrons move to locations where the potential is low. Thus, the electrons form a plurality of electron-hole pairs, which is referred to as impact ionization. Secondary electrons generated from the charge generation layer 132 may move to the variable resistance layer 131. If the variable resistance layer 131 is formed of porphyrin group polymer that stores charges, the secondary electrons may be stored in the variable resistance layer 131.

If the variable resistance layer 131 is formed of catacene or a programmable metallization cell material, the variable resistance layer 131 may attain a state of low resistance due to the presence of secondary electrons.

Accordingly, the variable resistance layer 131 may be converted to a low resistance layer by the introduction of the secondary electrons. Thus, the resistance between the lower electrode 110 and the upper electrode 120 may be reduced, and this state of data may be referred to as "1". A high resistance state may be in which electrons are absent in the variable resistance layer 131, and the state of data may referred to as "0". Thus, binary information is stored in the subpixel 130.

If the unit pixel 100 comprises 25 subpixels 130, 0 to 25 values of light intensity may be acquired. For example, if two sides of the unit pixel 100 are respectively 2 μm, and L1 and L2 are respectively 100 nm, the unit pixel 100 may include 400 subpixels 130. The red light in the red pixel R may be represented in 0 to 400 intensity values. That is, the dynamic range of the image sensor may be increased, thereby increasing the sensitivity of the image sensor.

Figure 4:
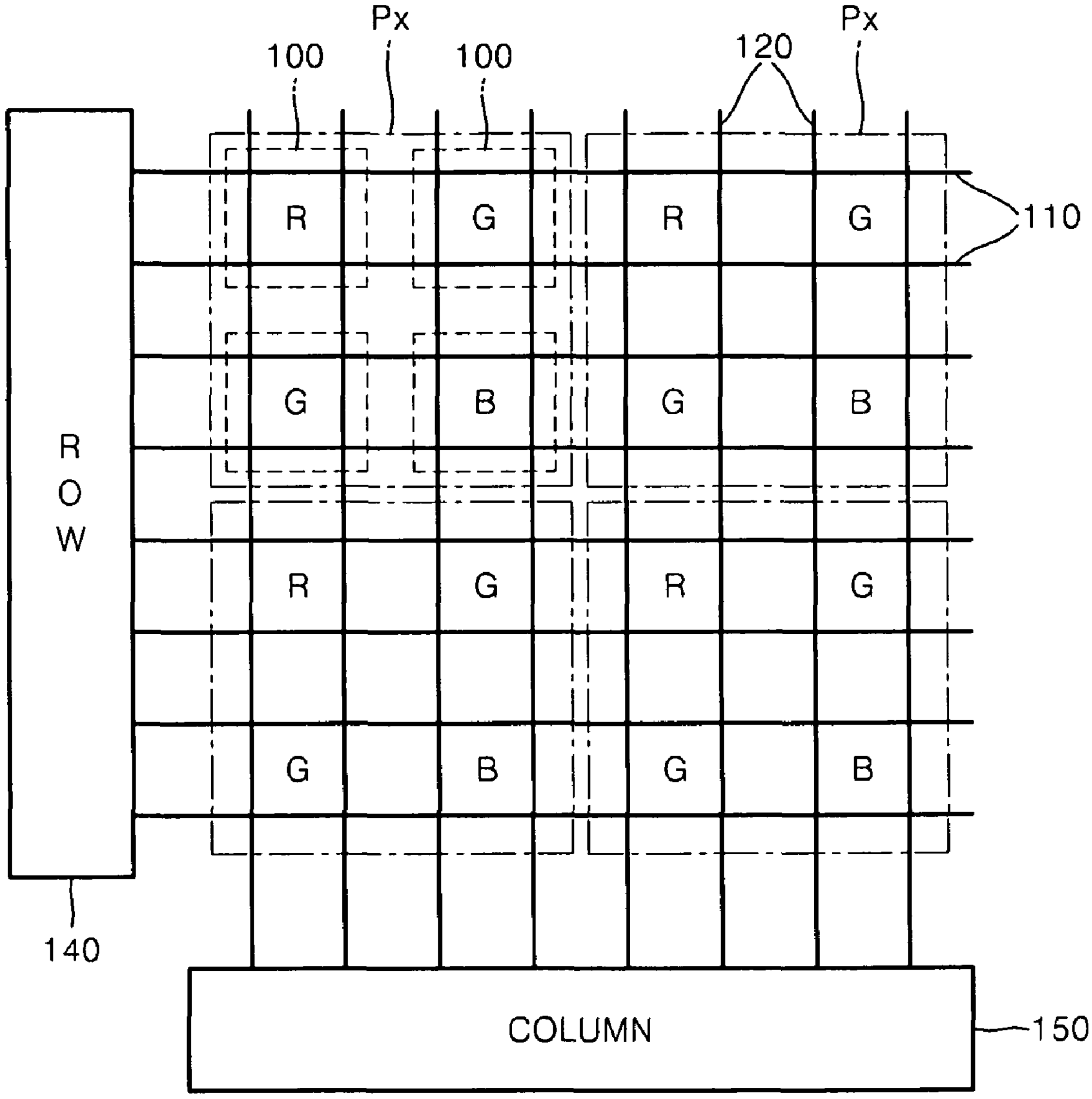
FIG. 4 shows an array of an image sensor that uses a photo-detecting molecule, according to an example embodiment.

FIG. 4 shows an array of an image sensor that uses a photo-detecting molecule, according to an example embodiment. Like reference numerals are used to indicate elements substantially identical to the elements of FIGS. 1 and 2, and their description is omitted.

Referring to FIG. 4, four unit pixels 100 including, for example, a red pixel R, a blue pixel B, and two green pixels G are disposed in a single pixel region PX. Each of the unit pixels 100 includes a plurality of subpixels 130 of FIG. 2. Color pixels disposed in a single pixel region PX may be arranged in a variety of different configurations, for example, three color pixels including a red pixel R, a blue pixel B, and a green pixel G may be disposed in a single pixel region PX.

The lower electrodes 110 are disposed in a direction perpendicular to that of the upper electrodes 120. In the array, the lower electrodes 110 may be row lines and the upper electrodes 120 may be column lines. Each of the lower electrodes 110 is connected to a row control unit 140, and each of the upper electrodes 120 is connected to a column control unit 150.

A method of operating an image sensor that uses a photo-detecting molecule according to an example embodiment will now be described with reference to drawings.

First, a method of writing data to an image sensor that uses a photo-detecting molecule will be described.

An electric field may be formed between the lower electrodes 110 and the upper electrodes 120 through the row control unit 140 and the column control unit 150. A voltage of approximately 3V is applied between the lower electrodes 110 and the upper electrodes 120, and a positive voltage is applied to the lower electrodes 110.

Next, light is irradiated onto the upper electrodes 120. Each color pixel absorbs light of a corresponding wavelength. Electron-hole pairs are formed in the photo-detecting molecule layer 133 of the subpixel 130 on which photons are irradiated. Electrons may move to the charge generation layer 132, and a plurality of electron-hole pairs are formed in the charge generation layer 132. Electrons may then move towards the lower electrodes 110, and may be stored in the variable resistance layer 131, lowering the resistance of the variable resistance layer 131. Thus, data "1" is recorded. The variable resistance layers 131 corresponding to the regions of the upper electrodes not irradiated with light remain in a high resistance state, and thus, data "0" is maintained.

A method of reading binary information from each of the subpixel regions will now be described. A read voltage may be applied to a single row line (a lower electrode 110) selected by the row control unit 140. The read voltage may be a negative voltage. The column control unit 150 may measure a current of each of the subpixels 130 by sequentially scanning the column lines including the upper electrodes 120. If a current measured in a column is greater than a known reference current value, the corresponding subpixel region is read as binary "1." If a current measured in a column is smaller than the known reference current value, the corresponding subpixel region is read as binary "0." Thus, when the number of subpixels of a single color pixel is 100, a detection intensity of light in the corresponding color pixel region may be the sum of the binary information in the corresponding color pixel region. Thus, the intensity of color in the corresponding pixel region is measured.

A method of erasing data of a subpixel will now be described.

A voltage opposite to the voltage applied for the writing operation is applied to the lower electrodes 110 and the upper electrodes 120. For example, if a positive voltage is applied to the upper electrodes 120, electrons stored in the variable resistance layer 131 are discharged through the upper electrodes 120, and thus, the subpixel region may enter a high resistance state, thereby erasing a data "1".

Figure 5:
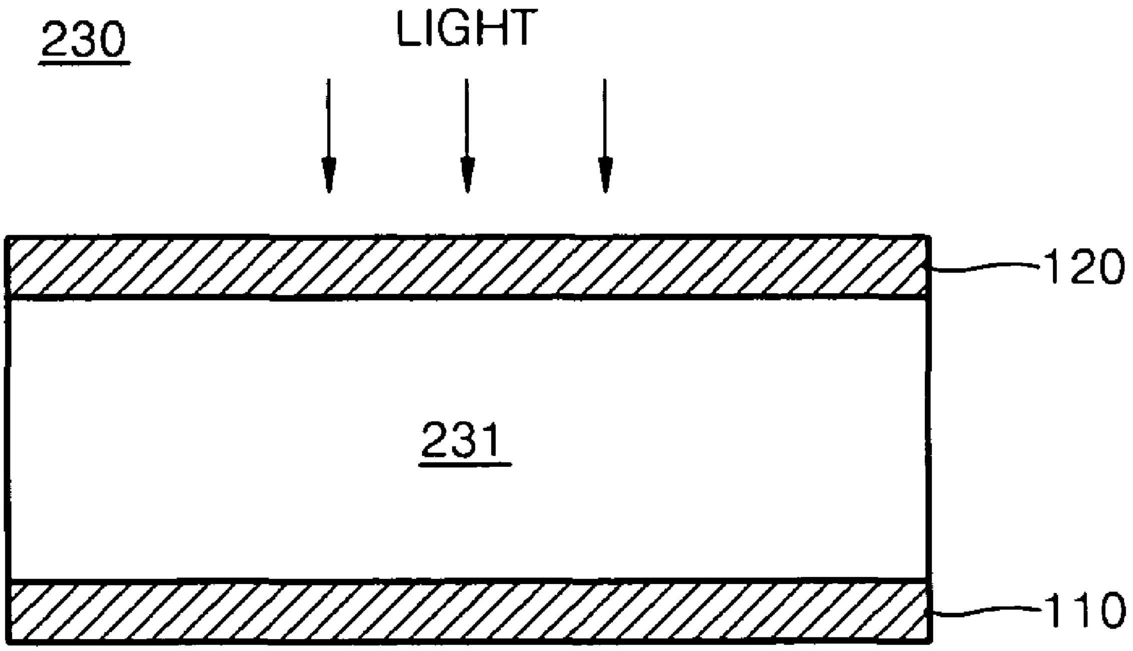
FIG. 5 is a cross-sectional view of the structure of a single subpixel of an image sensor that uses a photo-detecting molecule, according to another example embodiment.

FIG. 5 is a cross-sectional view of the structure of a single subpixel of an image sensor that uses a photo-detecting molecule according to another example embodiment. Like reference numerals are used to indicate substantially identical elements to the elements of the previous embodiments, and thus, their description will not be repeated.

Referring to FIG. 5, in a subpixel 230 a photo-detecting molecule material, a charge generation material, and a variable resistance material may form a composite 231 between a lower electrode 110 and an upper electrode 120. In other example embodiments the photo-detecting molecule material, the charge generation material and the variable resistance material may be mixed.

The photo-detecting molecule material may form electron-hole pairs by absorbing light having a certain wavelength. The photo-detecting molecule material may be formed of polymethyl methacrylate (PMMA) or polybutyl acrylate (PBA) that may include an organic dye or a polymer dye. The photo-detecting molecule material may absorb light of a specific wavelength, for example, one of red, green, or blue wavelengths according to the material of the photo-detecting molecule material.

A dye that may absorb blue wavelength may be, for example, p-Terphenyl, Polyphenyl 1, Stilbene 1, Stilbene 3, Coumarin 2, Courmarin 47, and Coumarin 102.

A dye that may absorb green wavelength may be, for example, Coumarin 30 and Rhodamine 6G.

A dye that may absorb red wavelength may be, for example, Rhodamine B, DCM (4 dycyanomethylene-2 methyl-6-p-dimethylaminostyryl-4H-pyran), and Rhodamine 700.

The charge generation material may be a material having a band gap of 1.0 eV or less in order to form a large amount of electron-hole pairs with a small energy. The charge generation material may be formed of polyisothionaphthene (Eg = 0.75 eV) or a copolymer (Eg=0.92 eV) in which quinonoid and benzoid are alternately formed.

The electrical state of the variable resistance material changes due to the movement of secondary electrons generated from the charge generation material. The variable resistance material may be formed of a porphyrin group polymer that may store charges, or a reconfigurable organic molecule such as catacene.

The variable resistance material may also be formed of a programmable metallization cell material, for example, a nickel oxide, a vanadium oxide or an iron oxide, the state of resistance of which may be high or low depending on a current.

The principle and operating method of the image sensor of FIG. 5 are substantially similar to the principle and operating method of the previous example embodiments, and their detailed description is omitted for sake of brevity.

Figure 6:
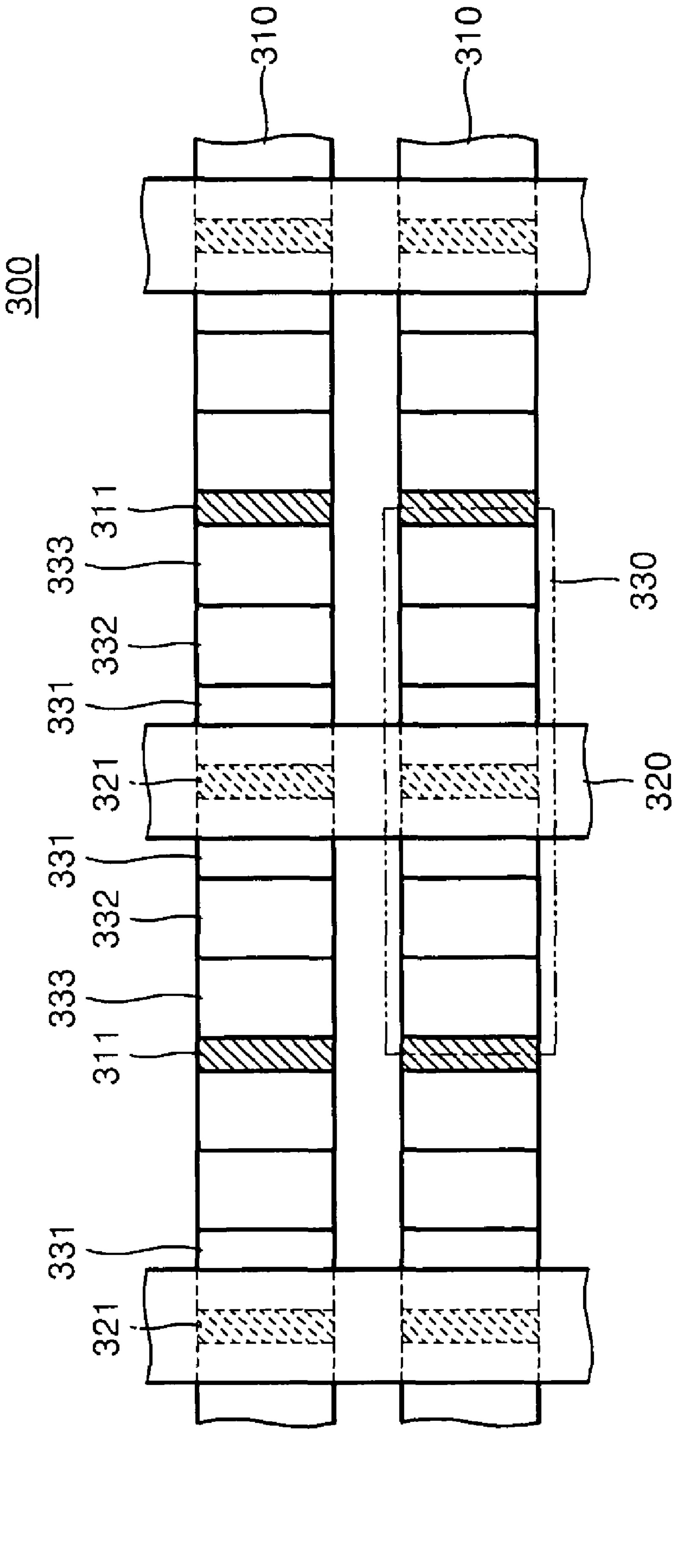
FIG. 6 is a plan view of a portion of a unit pixel of an image sensor that uses a photo-detecting molecule, according to an example embodiment.
Figure 7:
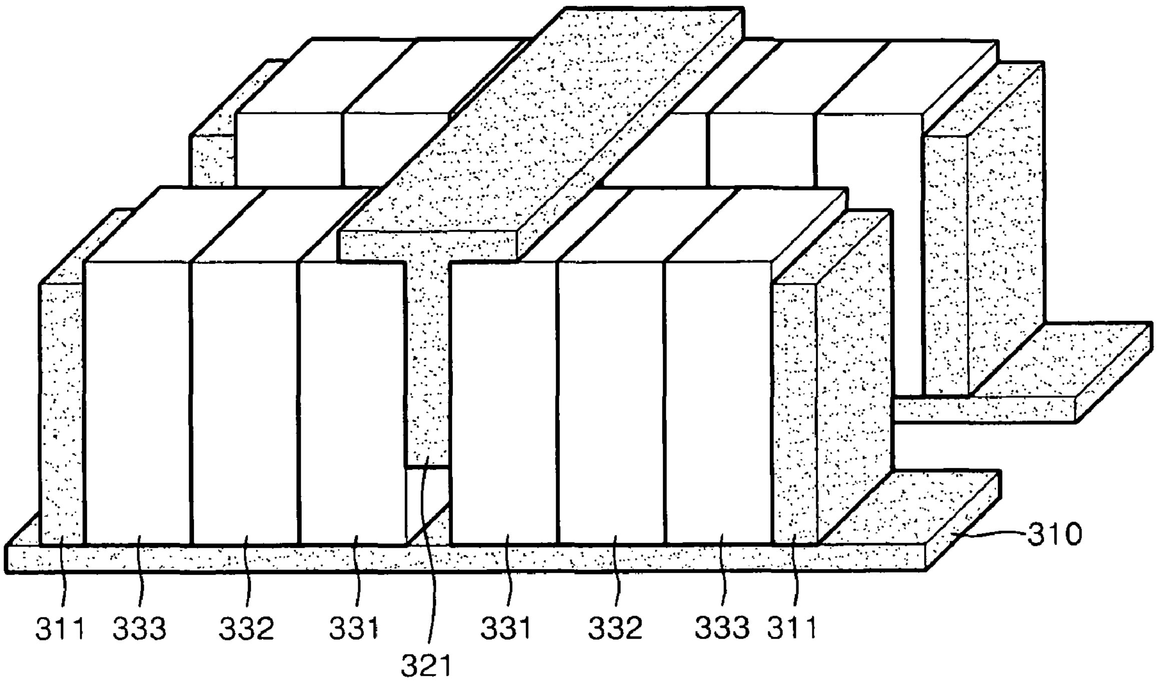
FIG. 7 is a perspective view of the unit pixel of the image sensor of FIG. 6.

FIG. 6 is a plan view of a portion of a unit pixel 300 of an image sensor that uses a photo-detecting molecule, according to an example embodiment and FIG. 7 is a perspective view of the unit pixel 300 of the image sensor of FIG. 6. Like reference numerals are used to indicate elements substantially identical to the elements of the previous example embodiments, and their description will be omitted.

Referring to FIGS. 6 and 7, the unit pixel 300 may include first electrode units 310 disposed parallel to each other on a substrate (not shown) and second electrode units 320 disposed in a direction perpendicular to the first electrode units 310 and above the first electrode units 310. The first electrode units 310 may include a plurality of first electrodes 311 perpendicular to the first electrode units 310 and extending towards the second electrode units 320. The second electrode units 320 may include a plurality of second electrodes 321 perpendicular to the second electrode units 320 and extending towards the first electrode units 310. Each of the second electrodes 321 may be disposed in the centre of a corresponding pair of the first electrodes 311. The first electrodes 311 and the second electrodes 321 may be parallel to each other and may be electrically insulated from each other.

A subpixel 330 may comprise one second electrode 321 and two first electrodes 311 that face the second electrode 321. A variable resistance layer 331, a charge generation layer 332, and a photo-detecting molecule layer 333 are sequentially stacked from the second electrode 321 towards the first electrode 311 and between the second electrode 321 and the first electrode 311.

When a positive voltage is applied between the first electrode unit 310 and the second electrode unit 320 and a positive voltage is applied to the second electrode unit 320, the potential of the second electrode 321 is lowered with respect to the first electrode 311. When light is irradiated onto the photo-detecting molecule layer 333, the photo-detecting molecule layer 333 may generate electron-hole pairs. The holes may be discharged to the outside through the first electrode 311, and the electrons may move towards the second electrode 321. The electrons may form a plurality of electron-hole pairs in the charge generation layer 332 which is referred to as impact ionization. Secondary electrons generated from the charge generation layer 332 may move to the variable resistance layer 331. The variable resistance layer 331 may store the secondary electrons and the electrical resistance of the variable resistance layer 331 may reduce.

The principle and operating method of the image sensor of FIGS. 6 and 7 is substantially similar to the principle and operating method of the previous example embodiment, and is therefore omitted for the sake of brevity.

In the image sensor of FIGS. 6 and 7, a composite layer may be formed by mixing the photo-detecting molecule layer 333, the charge generation layer 332, and the variable resistance layer 331.

Figure 8:
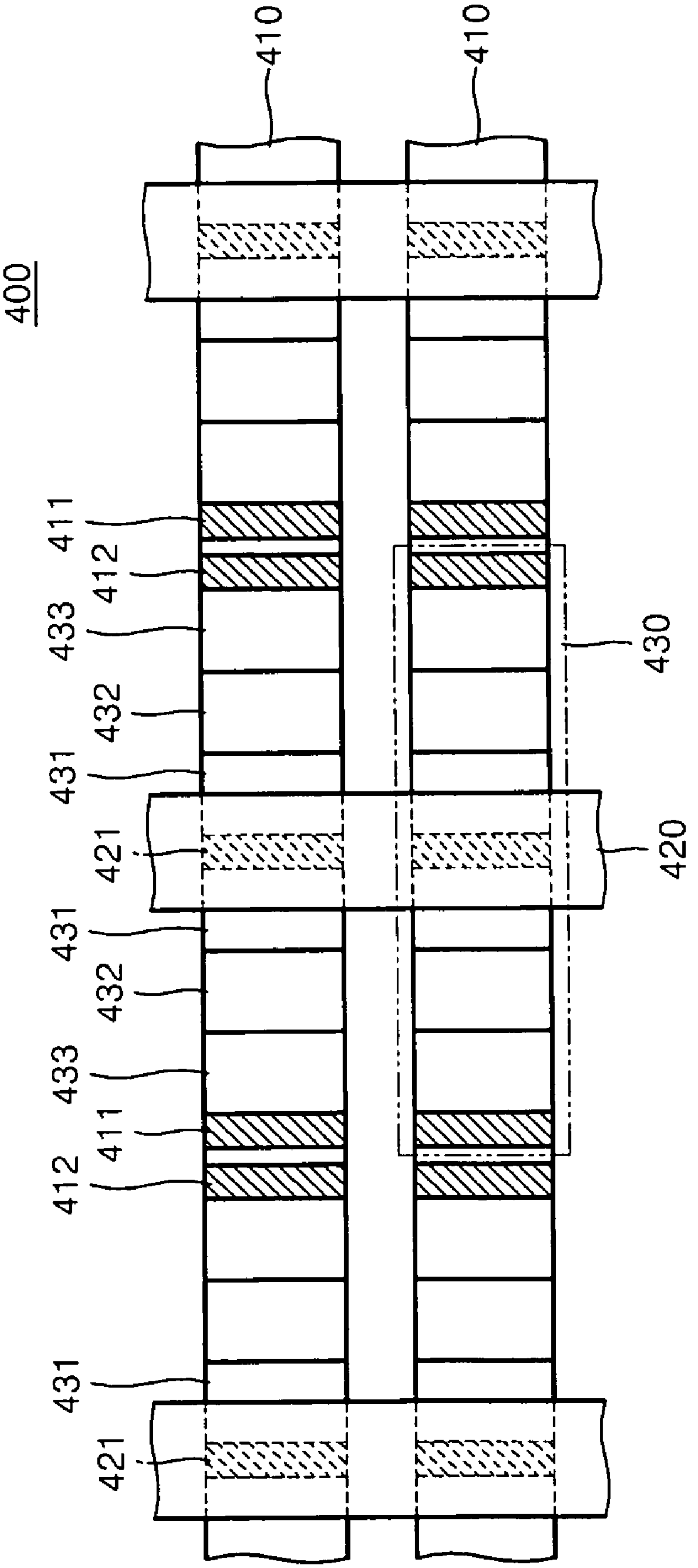
FIG. 8 is a plan view of a portion of a unit pixel of an image sensor that uses a photo-detecting molecule, according to another example embodiment.

FIG. 8 is a plan view of a portion of a unit pixel 400 of an image sensor that uses a photo-detecting molecule, according to another example embodiment. Like reference numerals are used to indicate elements substantially identical to the elements of FIGS. 6 and 7, and their description is omitted.

Referring to FIG. 8, the unit pixel 400 may include first electrode units 410 disposed parallel to each other on a substrate (not shown) and second electrode units 420 disposed in a direction perpendicular to the first electrode units 410 and above the first electrode units 410. The first electrode units 410 may include a plurality of first electrodes 411 and 412 perpendicular to the first electrode units 410 and extending towards the second electrode units 420. The second electrode units 420 may include a plurality of second electrodes 421 perpendicular to the second electrode units 420 and extending towards the first electrode units 410. Each of the second electrodes 421 may be disposed in the centre of a corresponding pair of the first electrodes 411 and 412. The first electrodes 411 and 412 and the second electrodes 421 may be parallel to each other and may be electrically insulated from each other.

A subpixel 430 may comprise one second electrode 421 and two first electrodes 411 and 412 that face the second electrode 421. A variable resistance layer 431, a charge generation layer 432, and a photo-detecting molecule layer 433 may be sequentially stacked from the second electrode 421 towards the first electrode 411 and 412 between the second electrode 421 and the first electrode 411 and 412.

That is, the first electrodes 411 and 412 corresponding to the second electrode 421 are separated in each of the subpixels 400, and thus, cross-talk between adjacent subpixels may be reduced compared to the subpixel 330 of FIG. 6.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A subpixel, comprising:

a photo-detecting molecule layer configured to generate charges by absorbing light of a certain wavelength;

a charge generation layer configured to generate a plurality of secondary electrons by receiving the charges from the photo-detecting molecule layer when a voltage is applied to the subpixel; and a variable resistance layer, an electrical state of the variable resistance layer being changed by the plurality of secondary electrons received from the charge generation layer.

2. An image sensor, comprising:
a plurality of the first electrodes parallel with each other and a plurality of the second electrodes parallel with each other in a direction perpendicular to the first electrodes and above the first electrodes; and
a plurality of the subpixels of claim 1 in regions where the first electrodes cross the second electrodes.

3. The image sensor of claim 2, wherein at least one of the first electrodes and the second electrodes are transparent electrodes.

4. The image sensor of claim 2, wherein the variable resistance layer is a porphyrin group polymer that stores charges.

5. The image sensor of claim 2, wherein the variable resistance layer includes at least one of a reconfigurable organic molecule and a programmable metallization cell material, a resistance of the variable resistance layer being lowered by the presence of charges.

6. The image sensor of claim 5, wherein the reconfigurable organic molecule is catacene.

7. The image sensor of claim 5, wherein the programmable metallization cell material is at least one of a nickel oxide, a vanadium oxide and an iron oxide.

8. The image sensor of claim 2, wherein the photo-detecting molecule layer, the charge generation layer, and the variable resistance layer form a composite and wherein the photo-detecting molecule layer, the charge generation layer, and the variable resistance layer are mixed.

9. The image sensor of claim 2, wherein the photo-detecting molecule layer, the charge generation layer, and the variable resistance layer are stacked.

10. An image sensor, comprising:
a plurality of first electrode units parallel to each other and a plurality of second electrode units parallel to each other in a direction perpendicular to the first electrode units and above the first electrode units;
a plurality of first electrodes perpendicular to the first electrode units and extending from the first electrode units towards the second electrode units;
a plurality of second electrodes perpendicular to the second electrode units and extending from the second electrode units towards the first electrode units; and
a plurality of the subpixels of claim 1 between the plurality of first and second electrodes.

11. The image sensor of claim 10, wherein at least one of the first electrode units and the second electrode units are transparent electrodes.

12. The image sensor of claim 10, wherein the variable resistance layer is a porphyrin group polymer that stores charges.

13. The image sensor of claim 10, wherein the variable resistance layer includes at least one of a reconfigurable organic molecule and a programmable metallization cell material, a resistance state of the variable resistance layer being lowered by the presence of charges.

14. The image sensor of claim 13, wherein the reconfigurable organic molecule is catacene.

15. The image sensor of claim 13, wherein the programmable metallization cell material is at least one of a nickel oxide, a vanadium oxide and an iron oxide.

16. The image sensor of claim 10, wherein the photo-detecting molecule layer, the charge generation layer, and the variable resistance layer form a composite.

17. The image sensor of claim 16, wherein the photo-detecting molecule layer, the charge generation layer, and the variable resistance layer are mixed.

18. The image sensor of claim 10, wherein light irradiates on the second electrode units, and the photo-detecting molecule layer, the charge generation layer, and the variable resistance layer are sequentially between a first electrode of the plurality of first electrodes and a second electrode of the plurality of second electrodes.

19. The image sensor of claim 18, wherein each subpixel includes the second electrode between at least two first electrodes of the plurality of first electrodes, and the photo-detecting molecule layer, the charge generation layer, and the variable resistance layer are between the second electrode and each of the at least two first electrodes.

20. The image sensor of claim 19, wherein each of the at least two first electrodes comprises two electrodes.

* * * * *